(12) United States Patent
Antonius Van De Rijdt

(10) Patent No.: US 10,151,988 B2
(45) Date of Patent: Dec. 11, 2018

(54) COMPONENT FOR A LITHOGRAPHY TOOL, A LITHOGRAPHY APPARATUS, AN INSPECTION TOOL AND A METHOD OF MANUFACTURING A DEVICE

(71) Applicant: ASML NETHERLANDS B.V., Veldhoven (NL)

(72) Inventor: Johannes Hubertus Antonius Van De Rijdt, Gemert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/513,108

(22) PCT Filed: Oct. 8, 2015

(86) PCT No.: PCT/EP2015/073213
§ 371 (c)(1),
(2) Date: Mar. 21, 2017

(87) PCT Pub. No.: WO2016/066392
PCT Pub. Date: May 6, 2016

(65) Prior Publication Data
US 2017/0299969 A1    Oct. 19, 2017

(30) Foreign Application Priority Data
Oct. 28, 2014  (EP) .................................. 14190599

(51) Int. Cl.
*G03F 7/20*    (2006.01)
(52) U.S. Cl.
CPC .......... *G03F 7/70875* (2013.01); *G03F 7/709* (2013.01); *G03F 7/70341* (2013.01);
(Continued)

(58) Field of Classification Search
CPC ............ G03F 7/70341; G03F 7/70875; G03F 7/70891; G03F 7/709
(Continued)

(56) References Cited

U.S. PATENT DOCUMENTS 6,952,253 B2   10/2005   Lof et al.
2004/0207824 A1   10/2004   Lof et al.
(Continued)

FOREIGN PATENT DOCUMENTS

EP    0484179 A2   5/1992
EP    1 420 298    5/2004
(Continued)

OTHER PUBLICATIONS

International Search Report and Written Opinion dated Jan. 29, 2016 in corresponding International Patent Application No. PCT/EP2015/073213.
(Continued)

*Primary Examiner* — Colin Kreutzer
(74) *Attorney, Agent, or Firm* — Pillsbury Winthrop Shaw Pittman, LLP

(57) ABSTRACT

A component for a lithography tool, the component including a member having a primary surface; a conduit defined within the member and configured to receive a fluid under pressure; a compressible region within the member and located between the conduit and the primary surface; and a deformable region between the compressible region and the conduit, wherein the compressible region and the deformable region are configured to accommodate local deformation of the member resulting from the pressure of the fluid.

21 Claims, 17 Drawing Sheets

(52) U.S. Cl.
CPC ...... *G03F 7/70783* (2013.01); *G03F 7/70858* (2013.01); *G03F 7/70891* (2013.01)

(58) Field of Classification Search
USPC .................................. 310/12.06; 355/30, 77
See application file for complete search history.

(56) References Cited

U.S. PATENT DOCUMENTS

| | | | | |
|---|---|---|---|---|
| 2005/0099611 | A1* | 5/2005 | Sogard | G02B 7/1815 |
| | | | | 355/30 |
| 2005/0128446 | A1* | 6/2005 | Miyajima | G03F 7/70891 |
| | | | | 355/30 |
| 2007/0114655 | A1* | 5/2007 | Hol | F28D 11/02 |
| | | | | 257/714 |
| 2008/0129969 | A1* | 6/2008 | Peng | G03F 7/70341 |
| | | | | 355/30 |
| 2008/0144202 | A1* | 6/2008 | Wevers | G02B 7/195 |
| | | | | 359/845 |
| 2009/0296068 | A1* | 12/2009 | Castelijns | G03F 7/70341 |
| | | | | 355/72 |
| 2010/0045949 | A1 | 2/2010 | Nakano et al. | |

FOREIGN PATENT DOCUMENTS

| | | |
|---|---|---|
| JP | 59-117128 A | 7/1984 |
| JP | 4-356921 A | 12/1992 |
| JP | 2004-246030 | 9/2004 |
| JP | 2005-004145 A | 1/2005 |
| JP | 2006-216784 | 8/2006 |
| JP | 2007-081279 A | 3/2007 |
| JP | 2010-114397 A | 5/2010 |
| JP | 2010-220403 A | 9/2010 |
| WO | 2013/171013 A1 | 11/2013 |
| WO | 2014/017661 A1 | 1/2014 |

OTHER PUBLICATIONS

Notice of Reasons for Rejection issued in corresponding Japanese Patent Application No. 2017-515700 dated Apr. 10, 2018 with English translation.

Notice of Reasons for Rejection issued in corresponding Japanese Patent Application No. 2017-515700 dated Aug. 2, 2018 with English translation.

* cited by examiner

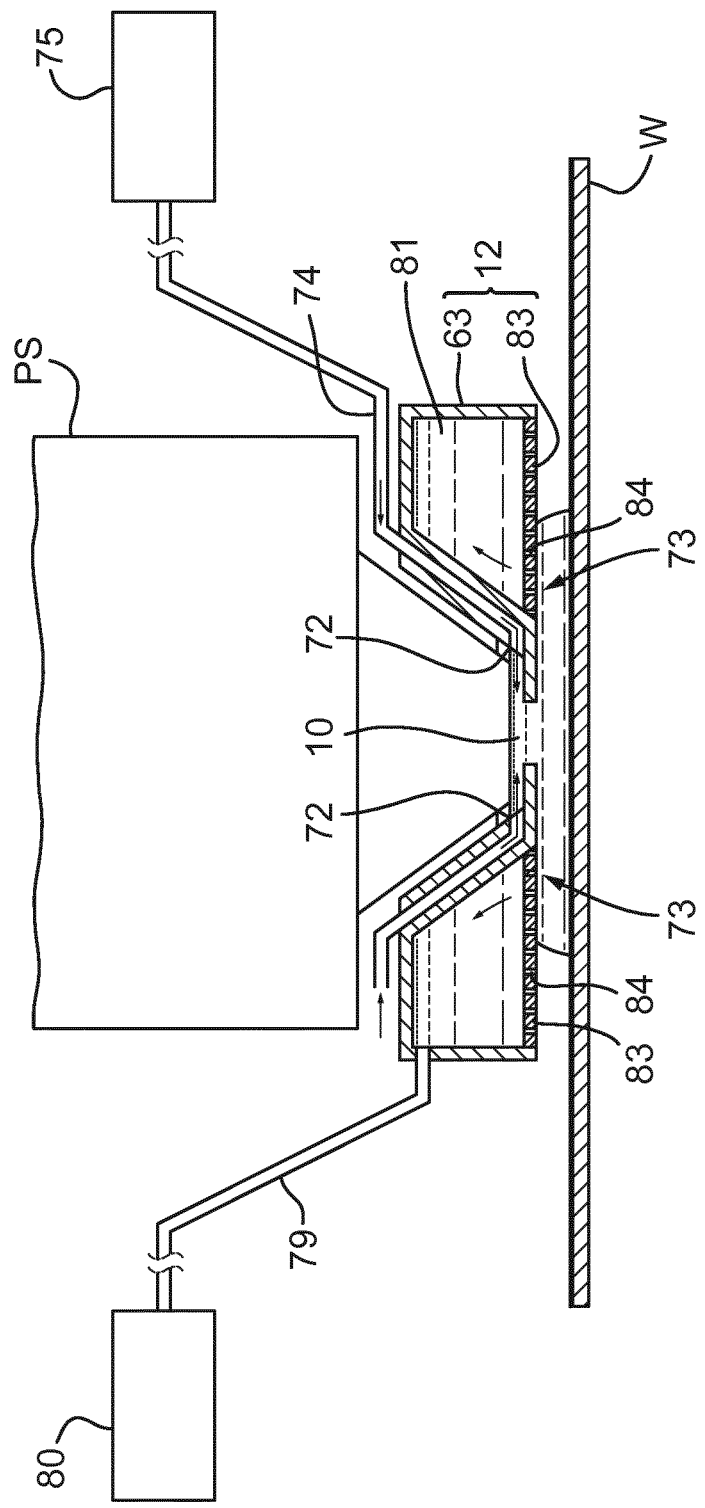

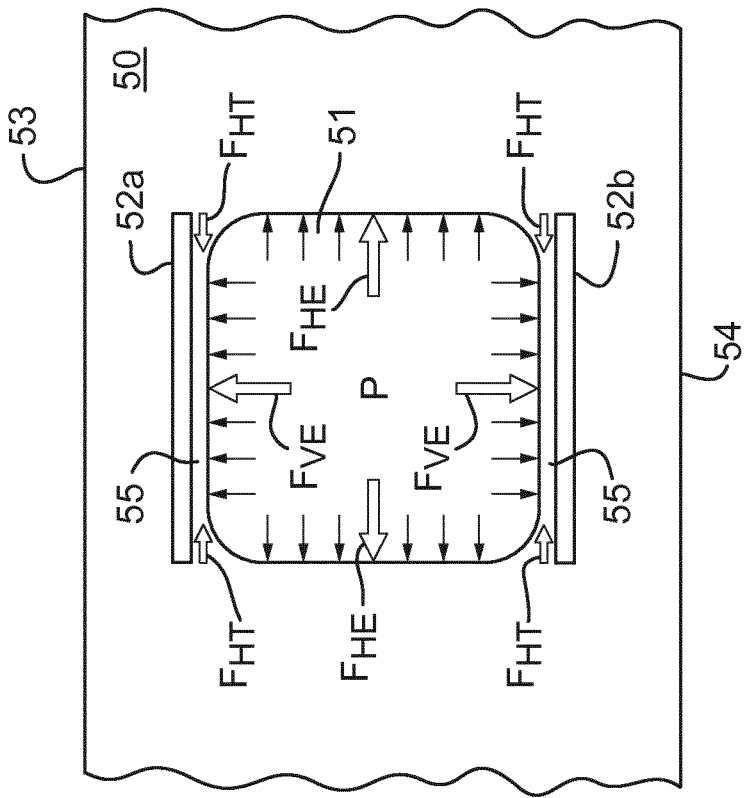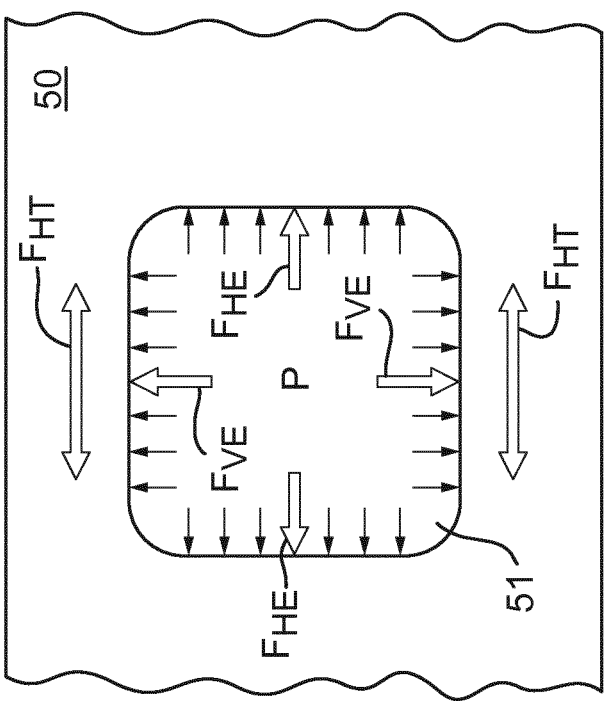

Fig. 16
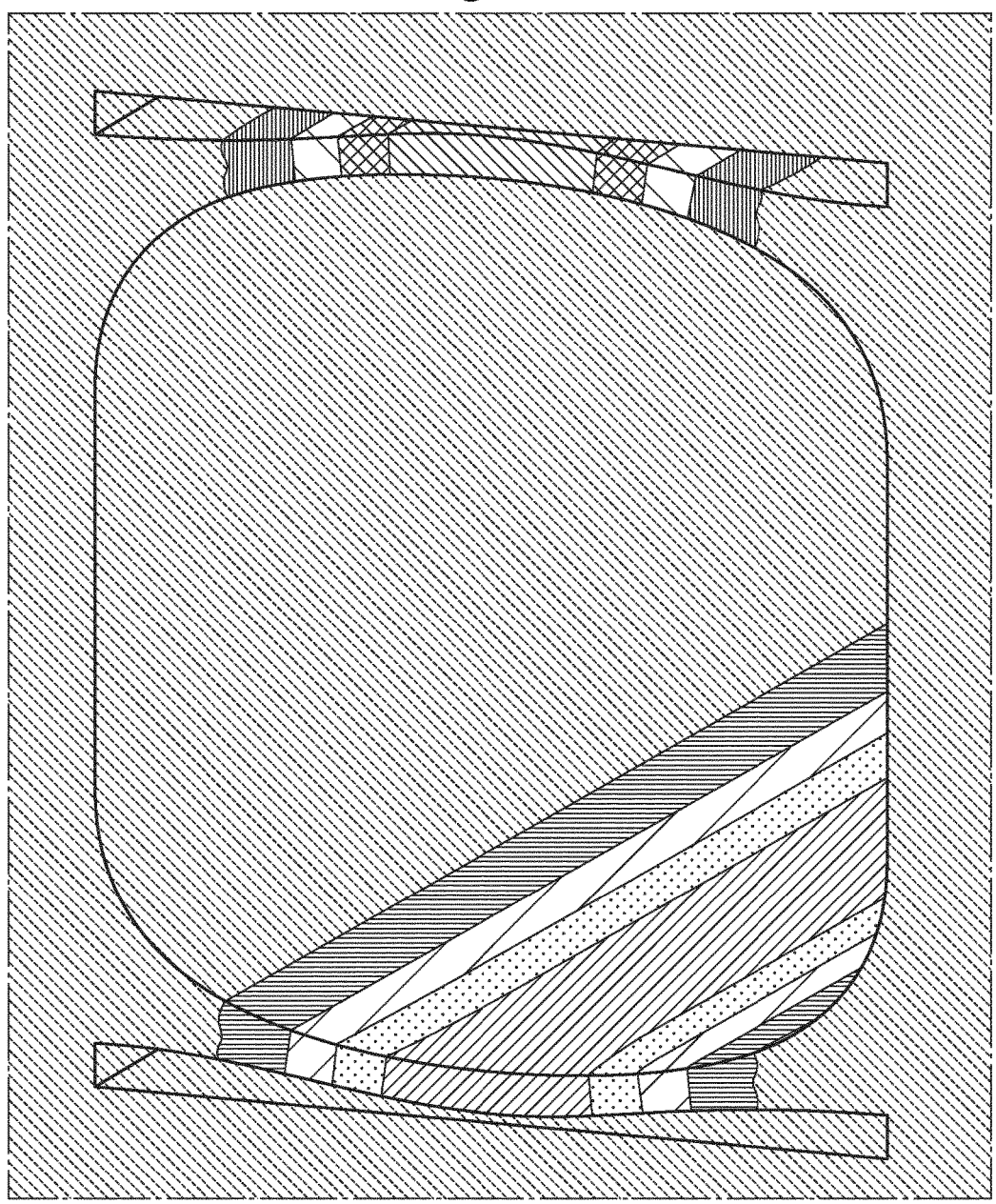
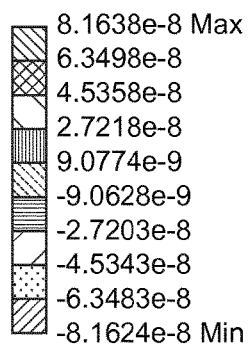

5.9038e6 Max
5.2478e6
4.5919e6
3.9359e6
3.2799e6
2.6239e6
1.9679e6
1.312e6
6.5598e5
1.7252 Min

COMPONENT FOR A LITHOGRAPHY TOOL, A LITHOGRAPHY APPARATUS, AN INSPECTION TOOL AND A METHOD OF MANUFACTURING A DEVICE

CROSS-REFERENCE TO RELATED APPLICATIONS

This application is the U.S. national phase entry of PCT patent application no. PCT/EP2015/073213, which was filed on Oct. 8, 2015, which claims the benefit of priority of European patent application no. 14190599.2, which was filed on Oct. 28, 2014, and which is incorporated herein in its entirety by reference.

FIELD

The present invention relates to a component for a lithography tool, a lithography apparatus, an inspection tool and a method of manufacturing a device using a lithography apparatus.

BACKGROUND

A lithography apparatus is a machine that applies a desired pattern onto a substrate, usually onto a target portion of the substrate. A lithography apparatus can be used, for example, in the manufacture of integrated circuits (ICs).

In the semiconductor industry there is a strong pressure to increase the density of devices, e.g. transistors, in an integrated circuit that can be formed on a substrate. To achieve increased densities, the accuracy and precision of lithography apparatuses and processes must be improved. For example, to form a device it is generally necessary to successively apply several patterns to a substrate with very high accuracy of placement. The placement error between patterns is known as overlay and the maximum allowed overlay might be only a few nanometers, especially for layers which must be formed with multiple patterning steps.

Within a lithography apparatus there are various components whose physical size or shape directly or indirectly affects the accuracy of the devices formed thereby. Examples include: a substrate table that holds the substrate to which a pattern is applied; and a reflector in a projection system. To maintain these and other components at their nominal sizes and/or shapes it is common to provide temperature control systems to maintain components at a specific temperature. Also, one component, e.g. a substrate table, may be maintained at a constant temperature in order to influence the temperature of another component, e.g. a substrate, which cannot itself be provided with a temperature control system. However, improvements in this regard are desirable.

SUMMARY

A temperature control system in a lithography apparatus may operate by circulating a thermal transfer fluid, e.g. water, through a conduit close to or in a component whose temperature is to be controlled. The temperature of the thermal transfer fluid is accurately controlled by a temperature control device, e.g. including a heater or a cooler. To maximize the efficiency of heat transfer between the component and the thermal transfer fluid, the conduit may be embedded within the body of a member of the component. For example the conduit may be formed directly by the material of the body of the member.

It has been determined that the pressure of a fluid, e.g. the thermal transfer fluid, in a conduit of a component can result in undesirable deformation of that component. It is therefore desirable to provide an arrangement for controlling the temperature of a component of a lithography apparatus that avoids or reduces deformation of the component.

According to an aspect of the invention, there is provided a device manufacturing method using a lithography apparatus having a component comprising:
  a member having a primary surface;
  a conduit defined within the member and configured to receive a fluid under pressure;
  a compressible region within the member and located between the conduit and the primary surface; and
  a deformable region between the compressible region and the conduit;
  wherein the compressible region and the deformable region are configured to accommodate local deformation of the member resulting from the pressure of the fluid.

According to an aspect of the invention, there is provided a component for a lithography tool, the component comprising:
  a member having a primary surface;
  a conduit defined within the member and configured to receive a fluid under pressure;
  a compressible region within the member and located between the conduit and the primary surface; and
  a deformable region between the compressible region and the conduit;
  wherein the compressible region and the deformable region are configured to accommodate local deformation of the member resulting from the pressure of the fluid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 is a side cross sectional view that schematically depicts a further liquid supply system according to an embodiment;

FIGS. 4A and 4B schematically depict a conventional conduit in a member and a conduit to which the teachings of the present disclosure have been applied;

DETAILED DESCRIPTION

Figure 1:
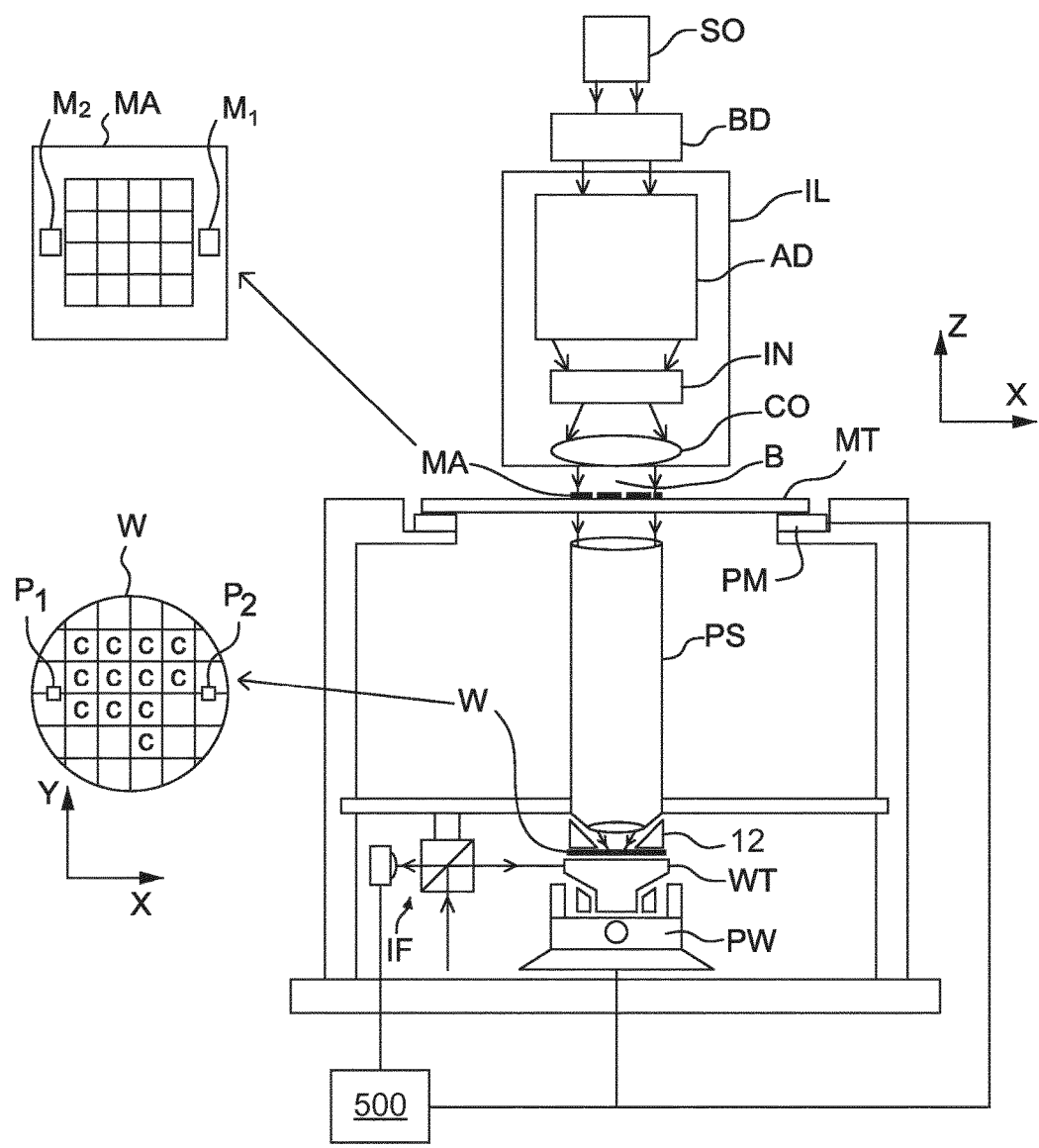
FIG. 1 schematically depicts a lithography apparatus.

FIG. 1 schematically depicts a lithography apparatus according to one embodiment of the invention. The apparatus includes an illumination system (illuminator) IL configured to condition a projection beam B (e.g. UV radiation or any other suitable radiation), a support structure (e.g. a mask table) MT constructed to support a patterning device (e.g. a mask) MA and connected to a first positioning device PM configured to accurately position the patterning device MA in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate W in accordance with certain parameters. The apparatus further includes a projection system (e.g. a refractive projection lens system) PS configured to project a pattern imparted to the projection beam B by the patterning device MA onto a target portion C (e.g. including one or more dies) of the substrate W.

The illumination system IL may include various types of optical components, such as refractive components, reflective components, magnetic components, electromagnetic components, electrostatic components or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithography apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the projection beam B may not exactly correspond to the desired pattern in the target portion C of the substrate W, for example if the pattern includes phase-shifting features or so called assist features. Generally, the pattern imparted to the projection beam B will correspond to a particular functional layer in a device being created in the target portion, such as an integrated circuit.

The patterning device MA may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithography apparatus may be of a type having two (dual stage) or more stages or tables. At least one of the tables has a substrate support that can hold a substrate. At least one of the tables may be a measurement table that is not configured to hold a substrate. In an embodiment two or more of the tables each have a substrate support. The lithography apparatus may have two or more patterning device tables or "mask supports". In such "multiple stage" machines the additional tables or supports may be used in parallel, or preparatory steps may be carried out on one or more tables or supports while one or more other tables or supports are being used for exposure.

The lithography apparatus is of a type wherein at least a portion of the substrate W may be covered by a liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in liquid; rather "immersion" only means that a liquid is located between the projection system PS and the substrate W during exposure. The path of the patterned radiation beam from the projection system PS to the substrate W is entirely through liquid. Although an immersion type lithography apparatus is described as an exemplary embodiment, the present invention also applies to non-immersion lithography apparatus.

Referring to FIG. 1, the illuminator IL receives a radiation beam from a radiation source SO. The radiation source SO and the lithography apparatus may be separate entities, for example when the radiation source SO is an excimer laser. In such cases, the radiation source SO is not considered to form part of the lithography apparatus. In arrangements where the radiation source SO is separate from the lithography apparatus, the radiation beam is passed from the radiation source SO to the illuminator IL with the aid of a beam delivery system BD including, for example, suitable directing mirrors and/or a beam expander. In other cases the radiation source SO may be an integral part of the lithography apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam, to have a desired uniformity and intensity distribution in its cross-section. Similarly to the source SO, the illuminator IL may or may not be considered to form part of the lithography apparatus. For example, the illuminator IL may be an integral part of the lithography apparatus or may be a separate entity from the lithography apparatus. In the latter case, the lithography apparatus may be configured to allow the illuminator IL to be mounted thereon. Optionally, the illuminator IL is detachable and may be separately provided (for example, by the lithography apparatus manufacturer or another supplier).

The projection beam B is incident on the patterning device MA (e.g., mask), which is held on the support structure MT (e.g., mask table), and is patterned by the patterning device MA. The projection beam B having been patterned by the patterning device MA may be referred to as a patterned beam. Having traversed the patterning device MA, the projection beam B passes through the projection system PS, which focuses the beam onto a target portion C of the substrate W. With the aid of the second positioning device PW and position sensor IF (e.g. an interferometric device, encoder or capacitive sensor), the substrate table WT can be moved accurately, e.g. so as to position different target portions C in the path of the projection beam B. Similarly, the first positioning device PM and another position sensor (which is not explicitly depicted in FIG. 1) can be used to accurately position the patterning device MA with respect to the path of the projection beam B, e.g. after mechanical retrieval from a mask library, or during a scan.

In general, movement of the support structure MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the support structure MT may be connected to a short-stroke actuator only, or may be fixed.

The patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The lithography apparatus further includes a lithography apparatus control unit 500 which controls all the movements and measurements of the various actuators and sensors described. The lithography apparatus control unit 500 also includes signal processing and data processing capacity to implement desired calculations relevant to the operation of the lithography apparatus. In practice, the lithography apparatus control unit 500 will be realized as a system of many sub-units, each handling the real-time data acquisition, processing and control of a subsystem or component within the lithography apparatus. For example, one processing subsystem may be dedicated to servo control of the second positioning device PW. Separate units may handle different actuators, or different axes. Another sub-unit might be dedicated to the readout of the position sensor IF. Overall control of the lithography apparatus may be controlled by a central processing unit. The central processing unit may communicate with the sub-units, with operators and with other apparatuses involved in the lithographic manufacturing process.

Arrangements for providing liquid between a final optical element of the projection system PS and the substrate W can be classed into three general categories. These are the bath type arrangement, the so-called localized immersion systems and the all-wet immersion systems. An embodiment of the present invention relates particularly to the localized immersion systems.

Figure 2:
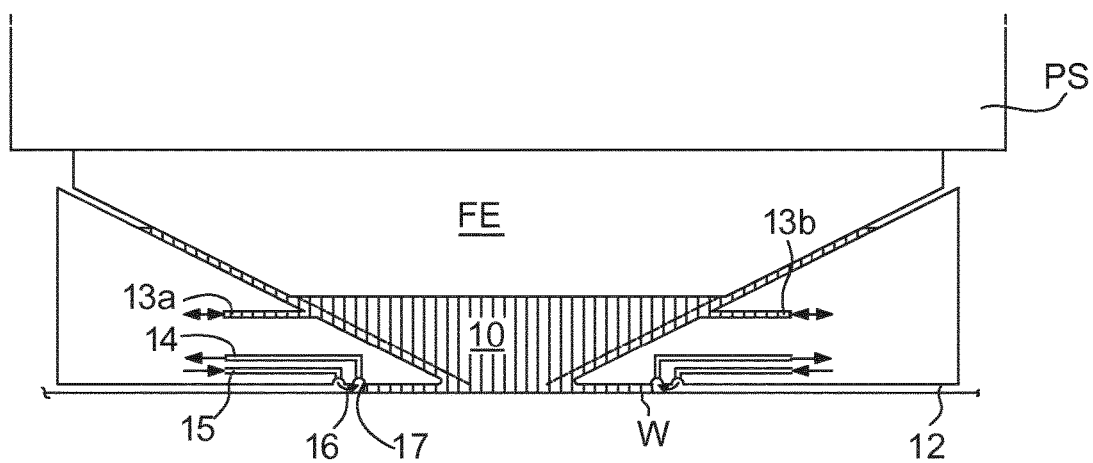
FIG. 2 schematically depicts a liquid confinement structure for use in a lithography apparatus.

In an arrangement which has been proposed for a localized immersion system a liquid confinement structure 12 extends along at least a part of a boundary of an immersion space 10 between the final optical element FE of the projection system PS and the facing surface of the stage or table facing the projection system PS. The facing surface of the table is referred to as such because the table is moved during use and is rarely stationary. Generally, the facing surface of the table is a surface of a substrate W, substrate table WT which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element FE of the projection system PS and the substrate table WT or substrate W. In an embodiment, a seal is formed between the liquid confinement structure 12 and the surface of the substrate W/substrate table WT. The seal may be a contactless seal such as a gas seal 16 (such a system with a gas seal is disclosed in European patent application publication no. EP-A-1,420,298) or a liquid seal.

The liquid confinement structure 12 is configured to supply and confine immersion liquid to the immersion space 10. Immersion liquid is brought into the immersion space 10 through one of liquid openings 13, e.g., opening 13a. The immersion liquid may be removed through one of liquid openings 13, e.g., opening 13b. The immersion liquid may be brought into the immersion space 10 through at least two liquid openings 13, e.g., opening 13a and opening 13b. Which of liquid openings 13 is used to supply immersion liquid and optionally which is used to remove immersion liquid may depend on the direction of motion of the substrate table WT.

Immersion liquid may be contained in the immersion space 10 by the gas seal 16 which, during use, is formed between the bottom of the liquid confinement structure 12 and the facing surface of the table (i.e. the surface of the substrate W and/or the surface of the substrate table WT). The gas in the gas seal 16 is provided under pressure via gas inlet 15 to a gap between the liquid confinement structure 12 and substrate W and/or substrate table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the liquid. The force of the gas on the liquid between the liquid confinement structure 12 and the substrate W and/or substrate table WT contains the liquid in the immersion space 10. A meniscus 17 forms at a boundary of the immersion liquid. Such a system is disclosed in United States patent application publication no. US 2004-0207824. Other liquid confinement structures 12 can be used with embodiments of the present invention.

FIG. 3 is a side cross sectional view that depicts a further liquid supply system or fluid handling system according to an embodiment. The arrangement illustrated in FIG. 3 and described below may be applied to the lithography apparatus LA described above and illustrated in FIG. 1. The liquid supply system is provided with a liquid confinement structure 12, which extends along at least a part of a boundary of the space between the final element of the projection system PS and the substrate table WT or substrate W. (Reference in the following text to surface of the substrate W also refers in addition or in the alternative to a surface of the substrate table WT, unless expressly stated otherwise.)

The liquid confinement structure 12 at least partly contains liquid in the immersion space 10 between the final element of the projection system PS and the substrate W and/or substrate table WT. The space 10 is at least partly formed by the liquid confinement structure 12 positioned below and surrounding the final element of the projection system PS. In an embodiment, the liquid confinement structure 12 comprises a main body member 63 and a porous member 83. The porous member 83 is plate shaped and has a plurality of holes 84 (i.e., openings or pores). In an embodiment, the porous member 83 is a mesh plate wherein numerous small holes 84 are formed in a mesh. Such a system is disclosed in United States patent application publication no. US 2010/0045949 A1.

The main body member 63 comprises one or more supply ports 72, which are capable of supplying the liquid to the immersion space 10, and a recovery port 73, which is capable of recovering the liquid from the immersion space 10. The one or more supply ports 72 are connected to a liquid supply apparatus 75 via a passageway 74. The liquid supply apparatus 75 is capable of supplying the liquid to the one or more supply ports 72. The liquid that is fed from the liquid supply apparatus 75 is supplied to the one or more supply ports 72 through the corresponding passageway 74. The one or more supply ports 72 are disposed in the vicinity of the optical path at a respective prescribed position of the main body member 63 that faces the optical path. The recovery port 73 is capable of recovering the liquid from the immersion space 10. The recovery port 73 is connected to a liquid recovery apparatus 80 via a passageway 79. The liquid recovery apparatus 80 comprises a vacuum system and is capable of recovering the liquid by sucking it via the recovery port 73. The liquid recovery apparatus 80 recovers the liquid recovered via the recovery port 73 through the passageway 79. The porous member 83 is disposed in the recovery port 73.

In an embodiment, to form the immersion space 10 with the liquid between the projection system PS and the liquid confinement structure 12 on one side and the substrate W on the other side, liquid is supplied from the one or more supply ports 72 to the immersion space 10 and the pressure in a recovery chamber 81 in the liquid confinement structure 12 is adjusted to a negative pressure so as to recover the liquid via the holes 84 (i.e., the recovery port 73) of the porous member 83. Performing the liquid supply operation using the one or more supply ports 72 and the liquid recovery operation using the porous member 83 forms the immersion space 10 between the projection system PS and the liquid confinement structure 12 and the substrate W.

In a lithography apparatus, the precise dimensions and/or shape of some components affect the process of applying a pattern to a substrate. For example, the external dimensions and surface contour (flatness) of a substrate support (which may also be referred to as a substrate holder) affect the positional accuracy of an imaging step. Any inaccuracy or change in the dimensions of the substrate holder can cause overlay errors. Any inaccuracy or change in the flatness of the substrate holder can cause local focus errors. Another example of a component whose dimensions and/or shape are critical is a reflector in a reflective or catadioptric projection system. Any error or change in the orientation of a reflector or in the local angle of the surface of the reflector can result in a misplaced or distorted image on the substrate. Other examples of components of a lithography apparatus whose precise shape and/or dimensions are important include a reference frame, an optical support system or a reticle support.

It is known to provide highly precise temperature control of components of a lithography apparatus and also the path of the projection beam. Temperature control is provided to prevent thermal expansion or contraction of components whose dimensions and/or shape are critical as well as to minimise or reduce temperature variations of the substrate being exposed. As well as controlling the temperature of gasses within the lithography apparatus (e.g. extremely clean dry air) a known approach to temperature control is to circulate a thermal transfer fluid (e.g. water) through conduits in various components of the lithography apparatus. The circulation of thermal transfer fluid may control the temperature of adjacent components, as well as controlling the temperature of the component in which the conduits are provided. To meet very tight temperature specifications, the thermal transfer fluid is often circulated at high rates of flow. A conduit provided within a component may have a complex path, often including sinuous sections, in order to ensure that the thermal transfer fluid flows close to all relevant parts of the component. Therefore, to achieve a desired flow rate the thermal transfer fluid is often provided at an elevated pressure, e.g. of about 2 bar above atmospheric pressure.

It has been determined that the pressure of a fluid, e.g. the thermal transfer fluid, within a conduit of a component of the lithography apparatus can cause changes in the dimensions and/or shape of the component. The changes in dimensions and/or shape of the component can vary over time due to variations in the pressure of the fluid. Changes in pressure of the fluid may be caused by changes in flow rate of the fluid necessary for temperature control and/or by movement of the component. Where a component includes multiple conduits or sinuous conduits the dimension and/or shape changes caused by each conduit or section of conduit can be cumulative. Whilst components of the lithography apparatus whose dimensions and/or shape are critical can be formed of very stiff materials, It has been determined that pressure-induced changes in the dimensions and/or shape of a component can be significant at the high levels of precision required in lithographic processes. The effects of pressure-induced changes depend on the specific component, as discussed below.

FIG. 4A illustrates a component having a member 50 having a conduit 51 of conventional form. Pressure P within the conduit exerts a horizontal expansion force $F_{HE}$ equal to the product of the pressure P, the conduit height and by the conduit length. Note that although the conduit 51 is illustrated as being substantially square with rounded corners, a shape which is easy to manufacture, a conduit may be of any cross-sectional shape and the horizontal expansion force is not dependent on the cross-sectional shape of the conduit, but only on the height and length of the conduit. In the steady state, the horizontal expansion force $F_{HE}$ caused by the pressure of the fluid within the conduit 51 is resisted by horizontal tension forces $F_{HT}$ in the material of the member 50 above and below the conduit 51. Note that the terms horizontal, above and below in this context describe only the arrangement in the drawings and the component may be arranged in orientation suitable for its function. The horizontal tension force $F_{HT}$ arises from the elastic properties of the material from which the component 50 is formed and hence arises only after the component has expanded horizontally. The pressure P within the conduit 51 also exerts vertical expansion forces $F_{VE}$ which will cause the member to deflect above and below conduit 51 and may result in externally detectable deformation of the surfaces of the member 50.

Of course expansion and surface deformation of member 50 due to the pressure P in conduit 51 can be reduced by making member 50 of a stiffer material or by making it thicker. However, other requirements on the member 50, such as having a low coefficient of thermal expansion and a high thermal conductivity, limit the choice of materials. Increasing the thickness of the member 50 above and below the conduit 51 would increase the mass of the member 50 which may for example, necessitate provision of more powerful motors to position the component. Also, increasing the thickness of member 50 would be detrimental to the effectiveness of the temperature control arrangements which may in turn necessitate increasing the flow rate and pressure of the thermal transfer fluid.

As shown in FIG. 4B, pressure induced deformation of member 50 can be controlled, e.g. reduced or eliminated, by the provision of one or more compressible regions 52a, 52b within member 50 near to the conduit 51. A first compressible region 52a is provided within the body of member 50 between conduit 51 and upper surface 53 of member 50. A second compressible region 52b is provided within the body of member 50 between conduit 51 and lower surface 54 of member 51. Compressible regions 52a, 52b can take the form of voids or slits within the body of member 50 or may be formed of a different material than the main body of member 50. The different material may have a bulk modulus lower than, e.g. less than one tenth of, the bulk modulus of the material from which the body of member 50 is constructed. The different material may be a polymer for example. The voids may be evacuated, e.g. to a pressure of less than 10 kPa, or may be in fluid communication with an external atmosphere to reduce the effective modulus of the void and make the mechanical behaviour of the member predictable.

Between the conduit 51 and compressible regions 52a, 52b, deformable regions, e.g. conduit walls 55, are formed. The conduit walls 55 can be formed of the same material as the body of member 50 or by a different material of similar or greater stiffness. The deformable region is deformable by virtue of its dimensions, especially its thickness, rather than because it is made of a low-stiffness material. Suitable dimensions for the deformable region will depend, inter alia, on the material of the member 50, the material of the deformable region (if different) and the expected pressure in the conduit 51. As an example, the deformable region may have a thickness at its narrowest point in the range of from 0.2 to 1.0 mm. The effect of the compressible regions 52a, 52b is that pressure in the conduit 51 causes the conduit walls 55 to deform into the compressible regions 52a, 52b. This has two effects that counteract the pressure-induced changes in the dimensions and/or shape of member 50.

Firstly, as the conduit walls 55 are deformed, the elastic properties thereof create a horizontal tension force $F_{HT}$ therein to resist the horizontal expansion force $F_{HE}$ caused by the pressure P within conduit 51. The horizontal tension force $F_{HT}$ within conduit walls 55 therefore prevents the member 50 expanding. The parts of the member 50 above compressible region 52a and below compressible region 52b are not placed under tension because the horizontal expansion force is counteracted by the horizontal tension force $F_{HT}$ within conduit walls 55 and therefore do not expand.

Secondly, the vertical deformation of the conduit walls 55 is accommodated by the compressible regions 52a, 52b and so no deformation is transmitted to the upper surface 53 and the lower surface 54 of the member 50.

Figure 5:
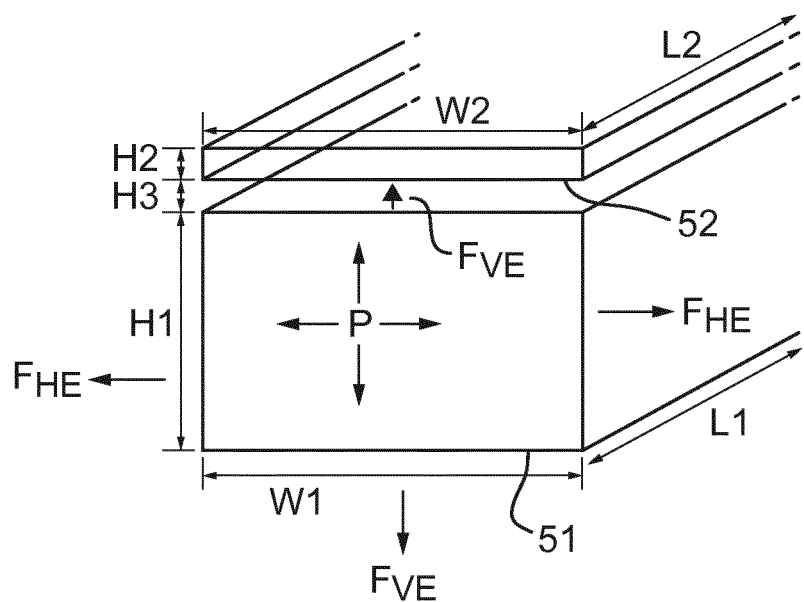
FIG. 5 schematically depicts forces arising in the vicinity of a conduit to which the teachings of the present invention have been applied.
Figure 6:
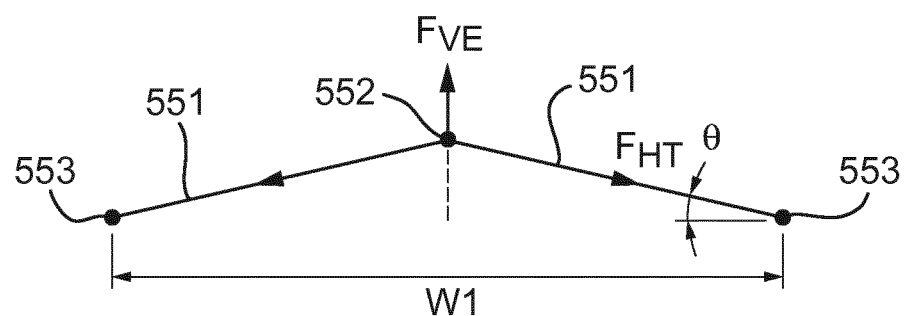
FIG. 6 schematically depicts forces arising in a deformable wall.

The effect of the compressible region and deformable region in the vicinity of the conduit 51 can be understood by reference to FIGS. 5 and 6. FIG. 5 shows in partial cross section a conduit 51 having a width W1, a height H1 and a length L1. The conduit 51 has a cross-section perpendicular to its length L1 that is rectangular. A compressible region 52 is provided close to the conduit 51 and has a width W2, height H2 and length L2. In an embodiment the width W2 of the compressible region 52 is equal to the width W1 of the conduit 51. However, W2 may be greater than or less than W1. If the width W2 of the compressible region 52 is very much less than the width W1 of the conduit 51 then the present invention may not be completely effective in preventing deformation of the member 50 but a useful reduction in deformation may still be achieved. If the width W2 of the compressible region 52 is greater than the width W1 of the conduit 51 then the invention is still effective but there may be an unnecessary weakening of the member 50 and/or an unnecessary reduction in the thermal conduction between the surface of the member 50 and the fluid within the conduit 51. In an embodiment, width W2 is no more than 120%, desirably no more than 110% of width W1. In an embodiment, width W2 is no less than 80%, desirably no less than 90%, of width W1.

Similarly, the length L2 of the compressible region 52 is desirably equal to the length L1 of conduit 51. However, if there are parts of the member 50 where deformation of the member 50 is not critical or is less critical than the compressible region can be omitted in these parts. The distance H3 between conduit 51 and compressible region 52 is determined in an embodiment as mentioned above. Distance H3 is effectively the thickness of the deformable region. The thickness of the deformable region need not be constant across its width. For example the deformable region may be thinner in the middle than at the edges.

As discussed above, pressure P within conduit 51 causes a horizontal expansion force $F_{HE}$ given by:

$$F_{HE} = P \cdot L1 \cdot H1$$

Similarly, a vertical expansion force is generated which is given by:

$$F_{VE} = P \cdot L1 \cdot W1$$

For simplicity we can model the conduit wall 55 as two rods 551 joined together at one end by a pivot 552 and anchored at the other ends 553 to the member 50 at either side of conduit 51. This arrangement is shown in FIG. 6. Assuming the vertical expansion force $F_{VE}$ is applied to the pivot 552, the pivot will move away from the straight line joining anchor points 553, stretching the rods 551 and causing a horizontal tension force $F_{HT}$ in the rods 551. The steady state will arise when the rods 551 are deflected to an angle θ such that:

$$F_{VE} = F_{HT} \cdot \sin \theta$$

The horizontal tension force $F_{HT}$ is inversely proportional to cos θ, with the constant of proportionality related to the stiffness of the material of the conduit wall 55 and the dimensions thereof. Thus, if the conduit wall 55 is made of a material having reasonably high stiffness, such as for example SiSiC or other ceramics, the thickness H3 of the conduit wall 55 can be quite thin whilst still enabling a large horizontal tension force $F_{HT}$ to be generated by small deflections of the conduit wall 55. Clearly, an actual embodiment of the present teachings will exhibit more complicated behaviour than that modelled by FIG. 6 but suitable dimensions for the compressible region 52 and deformable region (i.e., conduit wall 55) can readily be determined using methods such as finite element analysis.

Figure 7:
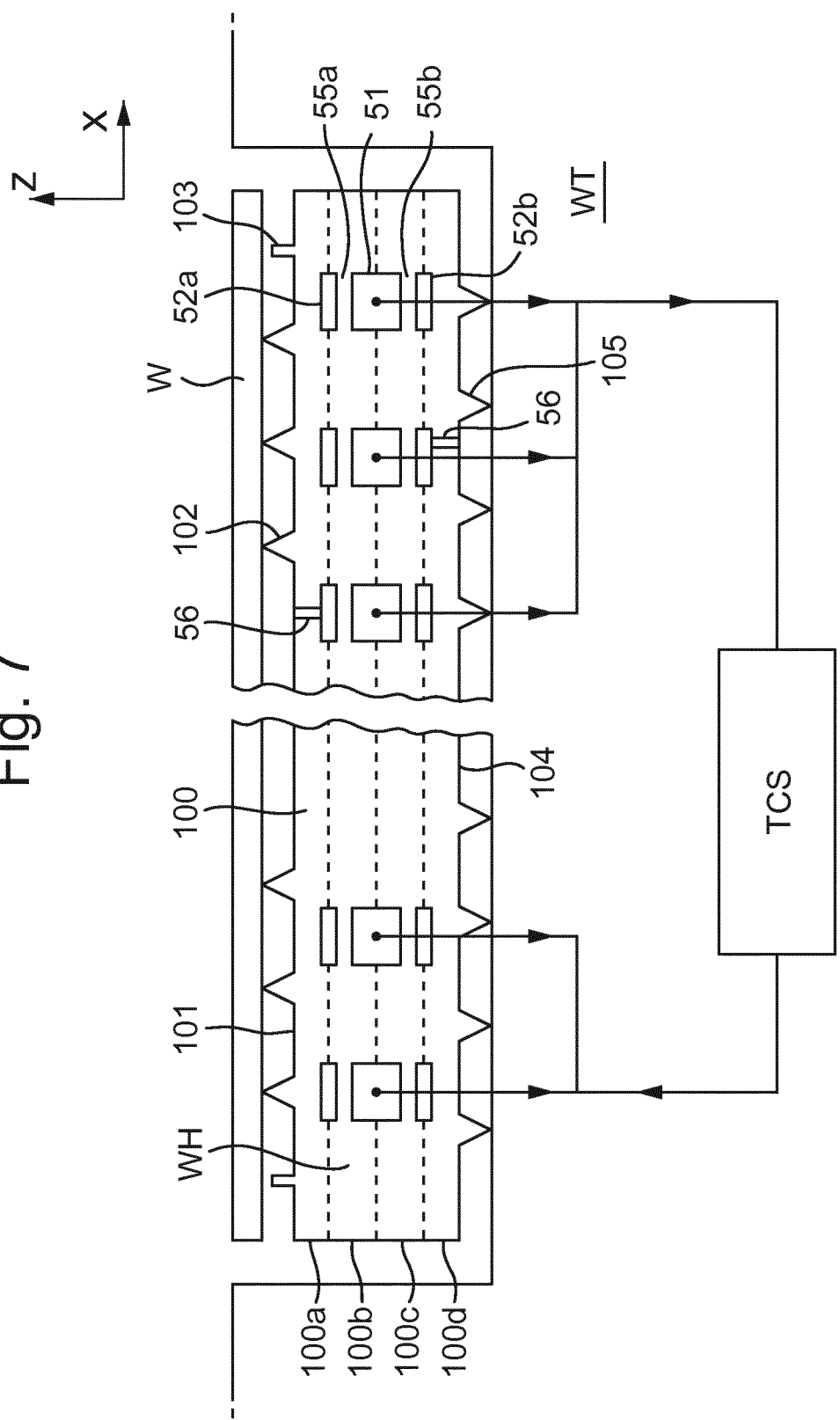
FIG. 7 schematically depicts a substrate table according to an embodiment.

FIG. 7 depicts in cross-section a substrate holder WH according to an embodiment of the invention. Substrate holder WH supports substrate W in the lithography apparatus and is itself supported by substrate table WT. Substrate holder WH comprises a main body 100 having an upper surface 101 from which project a plurality of burls 102. The main body 100 is an example of a member 50. The distal ends of burls 102 conform very accurately to a flat plane so as to support the substrate W in a flat state. There may be other projections from the upper surface 101 of substrate holder WH including, for example, a peripheral wall 103 to control the flow of gas into the space between substrate W and substrate holder WH. Various apertures, not shown, may be provided in substrate holder WH, for example: to accommodate e-pins which are used in the process of loading and unloading a substrate W to the substrate holder; and for use in evacuating the space between the substrate W and substrate holder WH in order to clamp the substrate W thereto. Instead of clamping the substrate W by vacuum, the substrate holder WH may be provided with electrodes to form an electrostatic clamp. The substrate holder WH may also be provided with an electronic component on upper surface 101, e.g. a resistive heater or a temperature sensor. Substrate holder WH may have a lower surface 104 which is also provided with a plurality of burls 105 so as to space the main body 100 of the substrate holder WH from a recess of the substrate table WT.

The shape and dimensions of the substrate holder WH are critical to proper patterning of the substrate W. If the upper surface 101 deforms, then that deformation is transferred to the substrate W and may lead to improper patterning thereof. Therefore the upper surface 100 may be considered to be a primary surface of the substrate holder WH. For example, if the substrate holder WH were to expand in a direction in the XY plane (i.e. perpendicular to the optical axis of the projection beam during exposure) this expansion would be transferred to the substrate W through burls 102 and result in incorrect placement of a pattern on the substrate, i.e. an overlay error. Similarly, local distortion of upper surface 101 of substrate holder WH would be transferred through burls 102 to substrate W and result in local unflatness of the substrate. This local unflatness may lead to localised focus errors, sometimes referred to as focus spots.

To maintain substrate holder WH at a constant temperature during use and thereby also control the temperature of substrate W, one or more conduits 51 are provided within the main body 100 of substrate holder WH. In an embodiment, there is a plurality of conduits 51 or a single conduit with a complex path so that all parts of the main body 100 are within a desired range of a conduit 51. A given cross-section through the main body 100 may therefore intersect multiple conduits 51 or the same conduit 51 several times. A thermal transfer fluid is circulated through conduit 51 by temperature control system TCS to effect temperature control of the substrate holder WH. A thermal transfer fluid may be, for example, water and is maintained at a desired temperature within a desired range, e.g. within plus or minus $10^{-4}$K. To achieve a desired flow rate through conduit 51 the thermal transfer fluid is supplied to conduit 51 at an elevated pressure, e.g. about 1 or 2 bar above atmospheric. The pressure of the thermal transfer fluid within conduit 51 may vary for several reasons. For example, it may be necessary to change the flow rate of the thermal transfer fluid to improve temperature control. Furthermore, the pressure of the thermal transfer fluid may vary due to movement of the substrate table WT.

To prevent the pressure of the thermal transfer fluid in conduit 51, and/or variations thereof, deforming substrate holder WH, compressible regions 52a, b are provided above and below conduit 51 in accordance with the teachings of this disclosure. Compressible regions 52a, b may take the form of a slit having the same width of the conduit 51 and extending along its entire length. Compressible regions 52a, b may be in fluid communication through vents 56 at one or more points along their lengths with the space above or below substrate holder WH. Deformable regions 55a, b are formed between the compressible regions 52a, b and conduit 51.

A conventional substrate holder with internal conduits can be manufactured by forming the main body 100 in two parts which are bonded together along the center line of the main body. In each part, half of the or each conduit 51 is formed by moulding or by removing material. A substrate holder WH having additional slits according to the teachings of the present disclosure can be manufactured by forming the main body 100 in four parts 100a, 100b, 100c and 100d which are bonded together along the dotted lines indicated in FIG. 7. As an alternative, a substrate holder WH according to an embodiment can be manufactured by an additive manufacturing technique.

Upper surface 101 of substrate holder WH is considered a primary surface of the substrate holder WH because deformations thereof affect patterning of a substrate W held on the substrate holder WH. Lower surface 104 can also be considered to be a primary surface of the substrate holder WH since deformations thereof may also affect the patterning of the substrate W. In this case, the effect of deformations in the lower surface 104 is less direct than the effect of deformations in the upper surface 101 since any deformations in the lower surface 104 have to be transmitted through substrate holder WH before affecting substrate W. Therefore, substantial advantage can still be obtained if only the compressible region 52a and deformable region 55a that are between conduit 51 and upper surface 101 are provided with the compressible region 52b below conduit 51 omitted. Omitting compressible region 52b can simplify and therefore reduce the cost of manufacture of the substrate holder WH.

Figure 8:
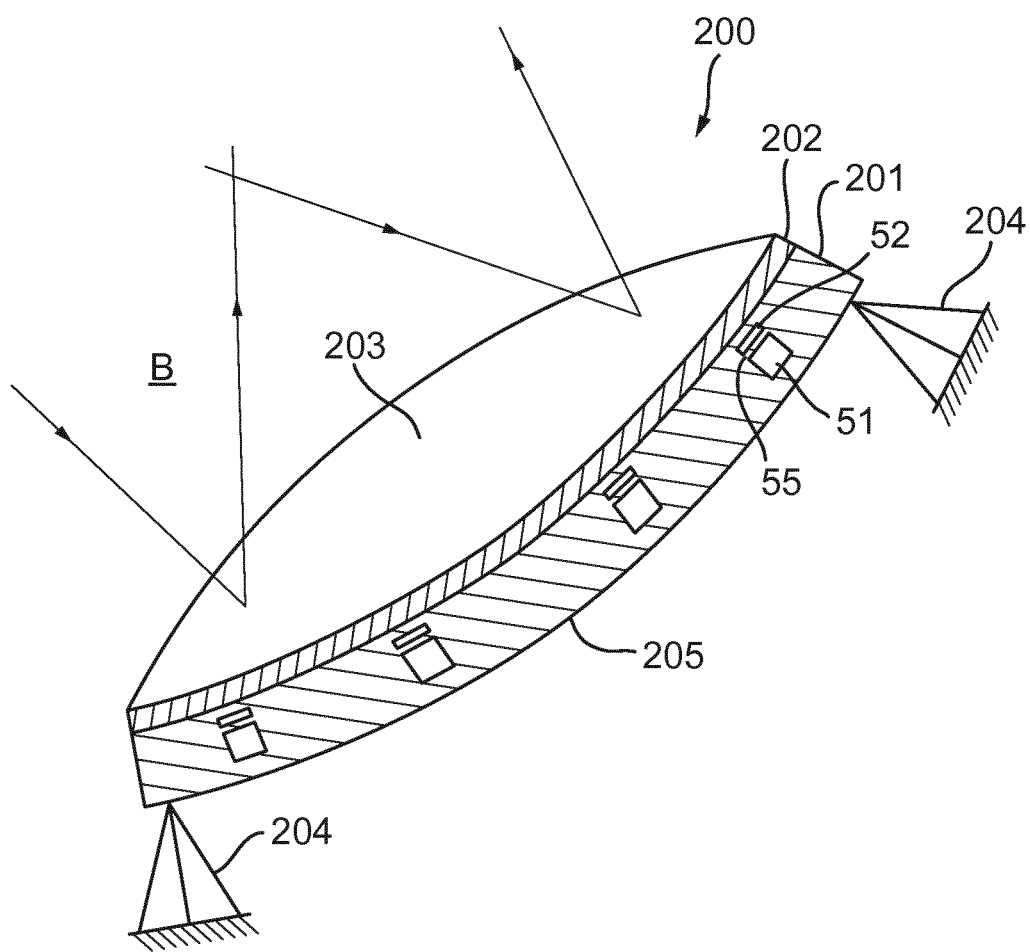
FIG. 8 schematically depicts a reflector according to an embodiment.

FIG. 8 depicts in partial cross-section a reflector according to an embodiment of the invention that can be used in a reflective or catadioptric optical system of a lithography apparatus, for example the projection system PS. A reflective optical system is useful in lithography apparatus employing EUV radiation for the projection beam B. Reflector 200 comprises a reflector substrate 201 formed of a material having a high stiffness and a low co-efficient of thermal expansion, e.g. Zerodur™ or ULE™. A multilayer coating 202 is provided on the reflector substrate 201 and takes the form of a distributed Bragg reflector in order to reflect near normal incident EUV radiation. The reflective surface 203 of multilayer coating 202 forms a primary surface of the reflector 200 as deformations of the reflective surface 203 affect the pattern projected onto the substrate W. In particular, changes in the overall orientation of reflective surface 203 will change the position of the pattern projected onto the substrate. Local variations in the angle of reflective surface 203 will distort the pattern projected onto the substrate W. Small expansions or contractions of reflector substrate 200 may not have a significant effect on the projected pattern unless they result in changes to the orientation or surface contour of the reflective surface 203. Reflector 200 can be mounted on active mounts 204 which are controlled to maintain the desired orientation of the reflective surface 203.

In spite of the use of a multilayer coating 202, the reflectivity of an EUV reflector is only of the order of 70%. Therefore, an EUV reflector experiences a substantial heat load during use and active cooling thereof is desirable. Similarly to the substrate holder of FIG. 7, one or more conduits 51 for a thermal transfer fluid are provided within reflector substrate 201. Conduit 51 may have a complex path within reflector substrate 201 in order to ensure that all parts of the reflector 200 are adequately cooled. Multiple conduits 51 may also be provided. Compressible region 52 is provided between conduit 51 and the reflective surface 203 so that deformable region 55 is formed between conduit 51 and compressible region 52. Since local deformation of the rear surface 205 and overall growth of the reflector substrate 201 do not affect the projected pattern, it may be unnecessary to provide a compressible region between conduit 51 and rear surface 205. However, with only a single compressible region 52 between conduit 51 and reflective surface 203, an asymmetric load in the reflector substrate 201 might arise. Such an asymmetric load might lead to bending of the reflector 200. If such bending does occur to an unacceptable extent, one or more additional compressible regions can be provided to prevent the asymmetric load.

Similarly to the substrate holder WH of FIG. 7, reflector substrate 201 can be formed by an additive manufacturing technique or by bonding together several layers which have been machined or moulded to form the conduit 51 and compressible region 52. Appropriate dimensions for the compressible region 52 and deformable region 55 can be determined by a technique such as finite element analysis. Due to the high heat load experienced by a reflector 200 in an EUV lithography apparatus, the flow rate of the thermal transfer fluid and therefore the pressure of the thermal transfer fluid may be higher than in a substrate holder WH.

Figure 9:
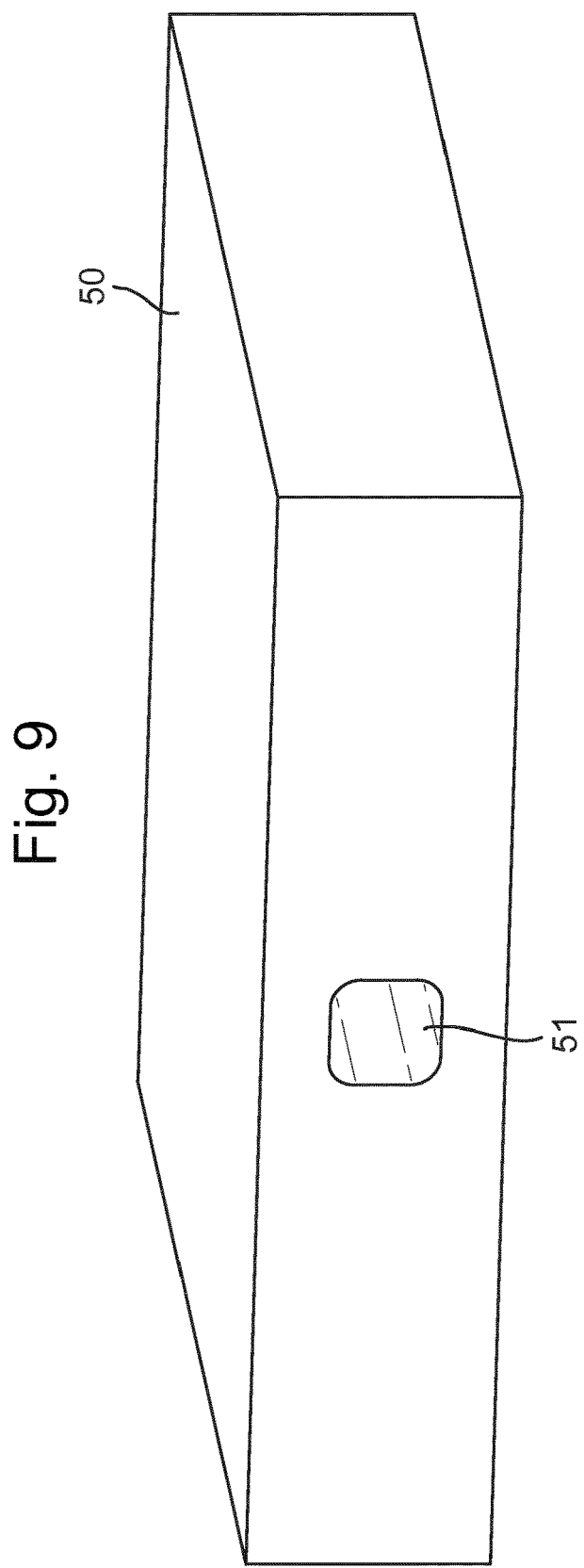
FIGS. 9 to 18 depict simulation results comparing a component having a conventional conduit and a component having a conduit to which teachings of the present disclosure have been applied.
Figure 10:
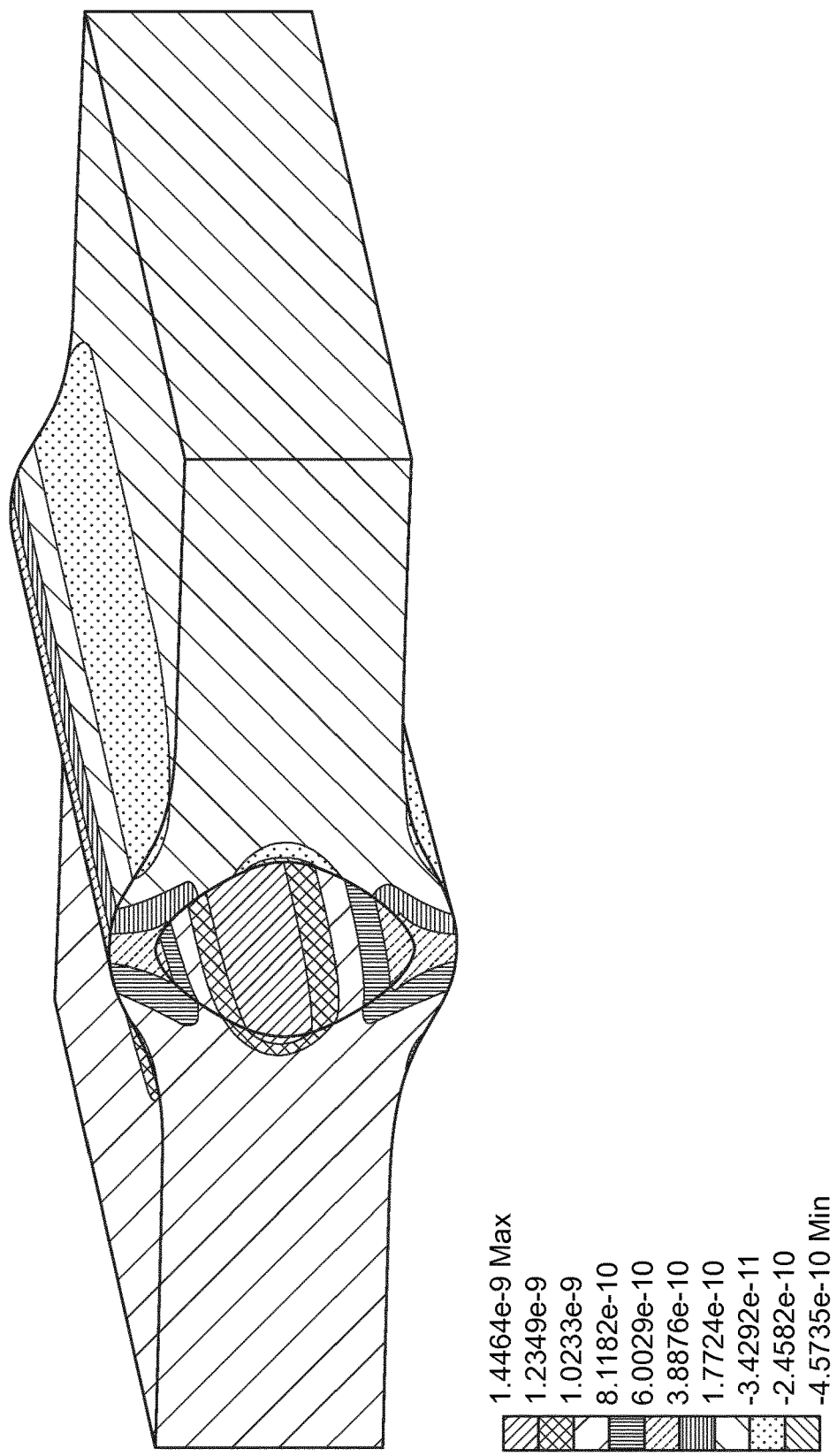
Figure 11:
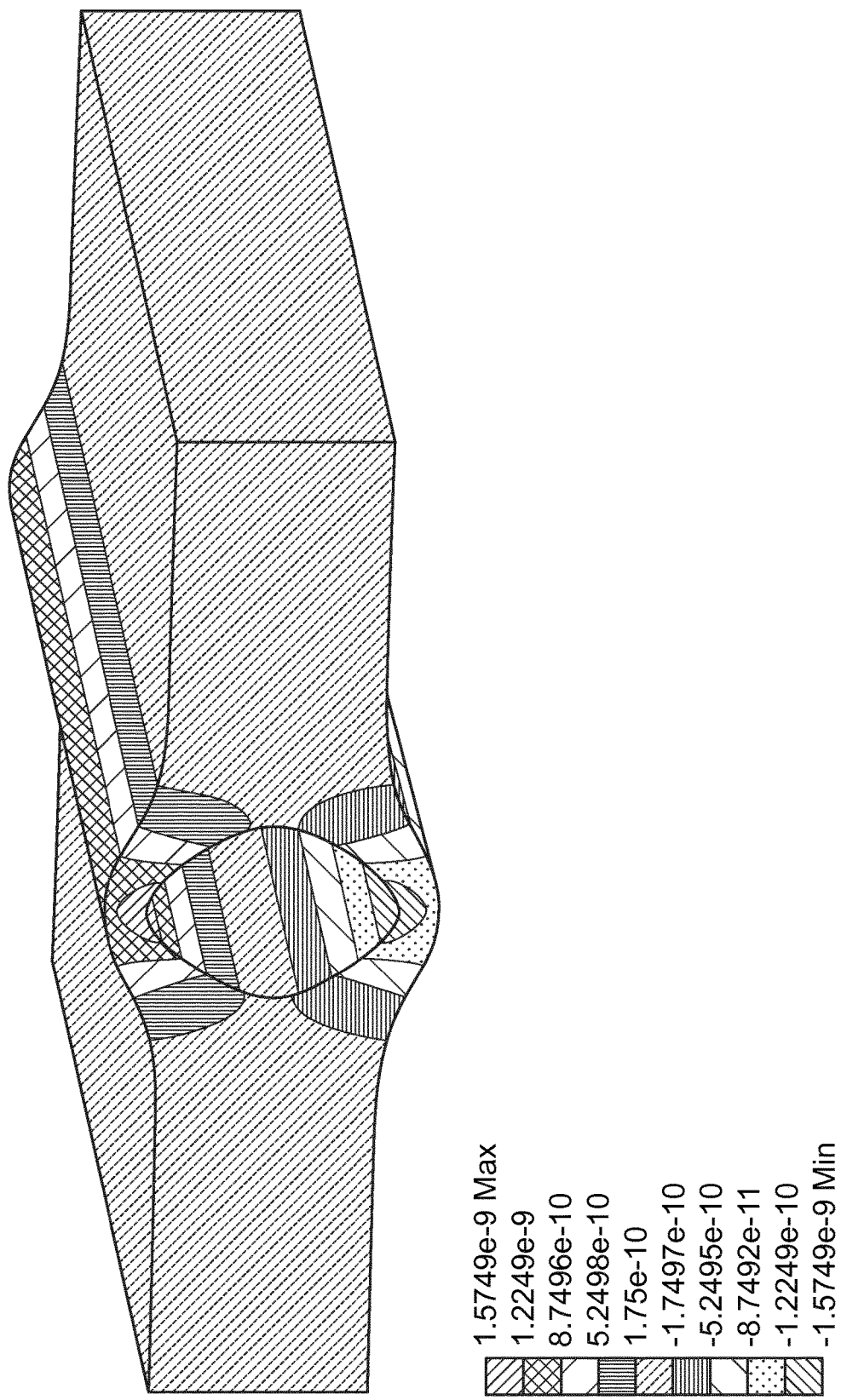
Figure 12:
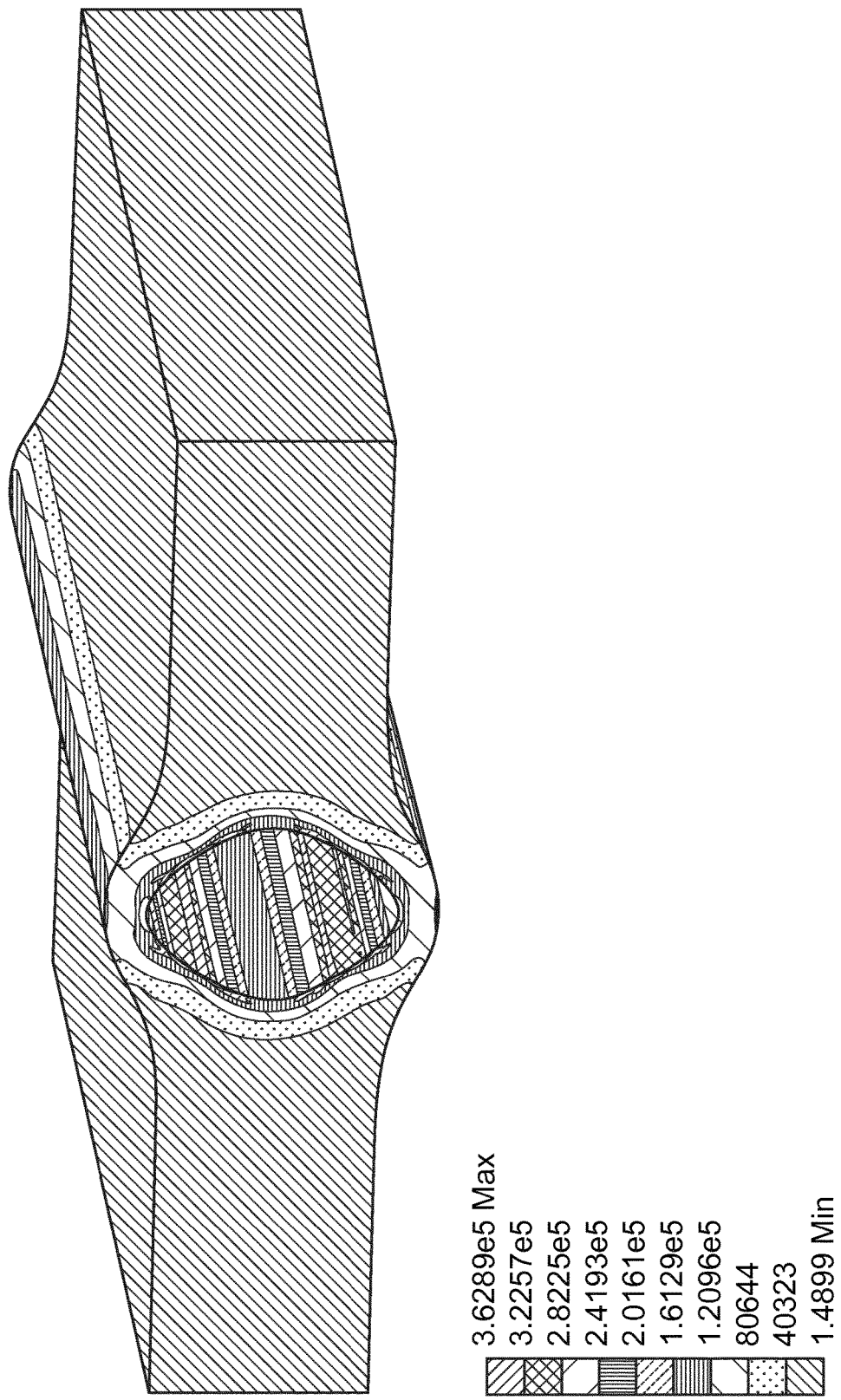

To verify the benefits of the teachings of the present disclosure, simulations of a simplified example were carried out. The results are illustrated in FIGS. 9 to 18. The simulated reference example is shown in FIG. 9 and consists of a solid body of SiSiC equivalent to member 50 having a conduit 51 extending horizontally through the center thereof. FIG. 10 shows the horizontal deformation resulting from the simulated application of a pressure of 1 bar in the conduit 51. Different styles of hatching in the drawing indicate different amounts of deformation as indicated by the scale. The change in shape of the body is massively exaggerated in the Figure so as to make it visible. Peak deformations greater than 1 nm are predicted. FIG. 11 illustrates the simulated vertical deformation. Again different styles of hatching indicate different amounts of deformation as indicated by the scale and the change in shape is grossly exaggerated for illustrative purposes. Deformation at the surface of about 1 nm is again predicted. FIG. 12 illustrates the equivalent (von-Mises) stress in Pascals, again by different styles of hatching.

Figure 13:
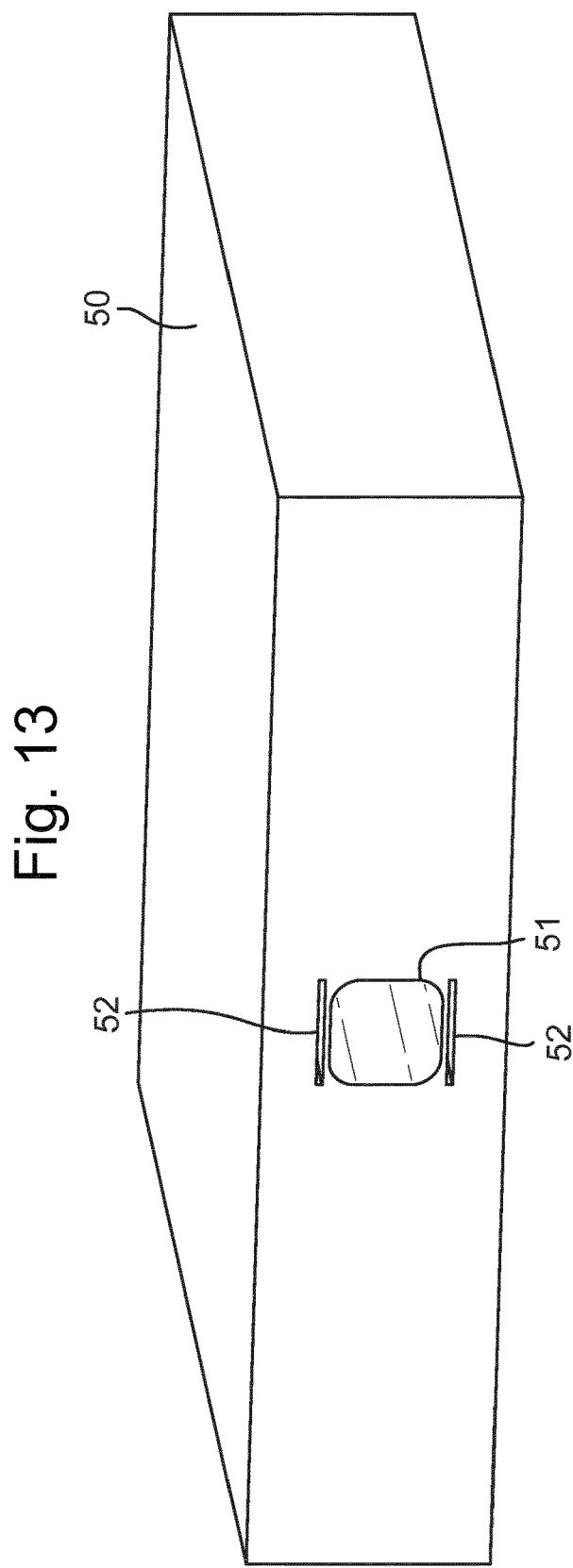
Figure 14:
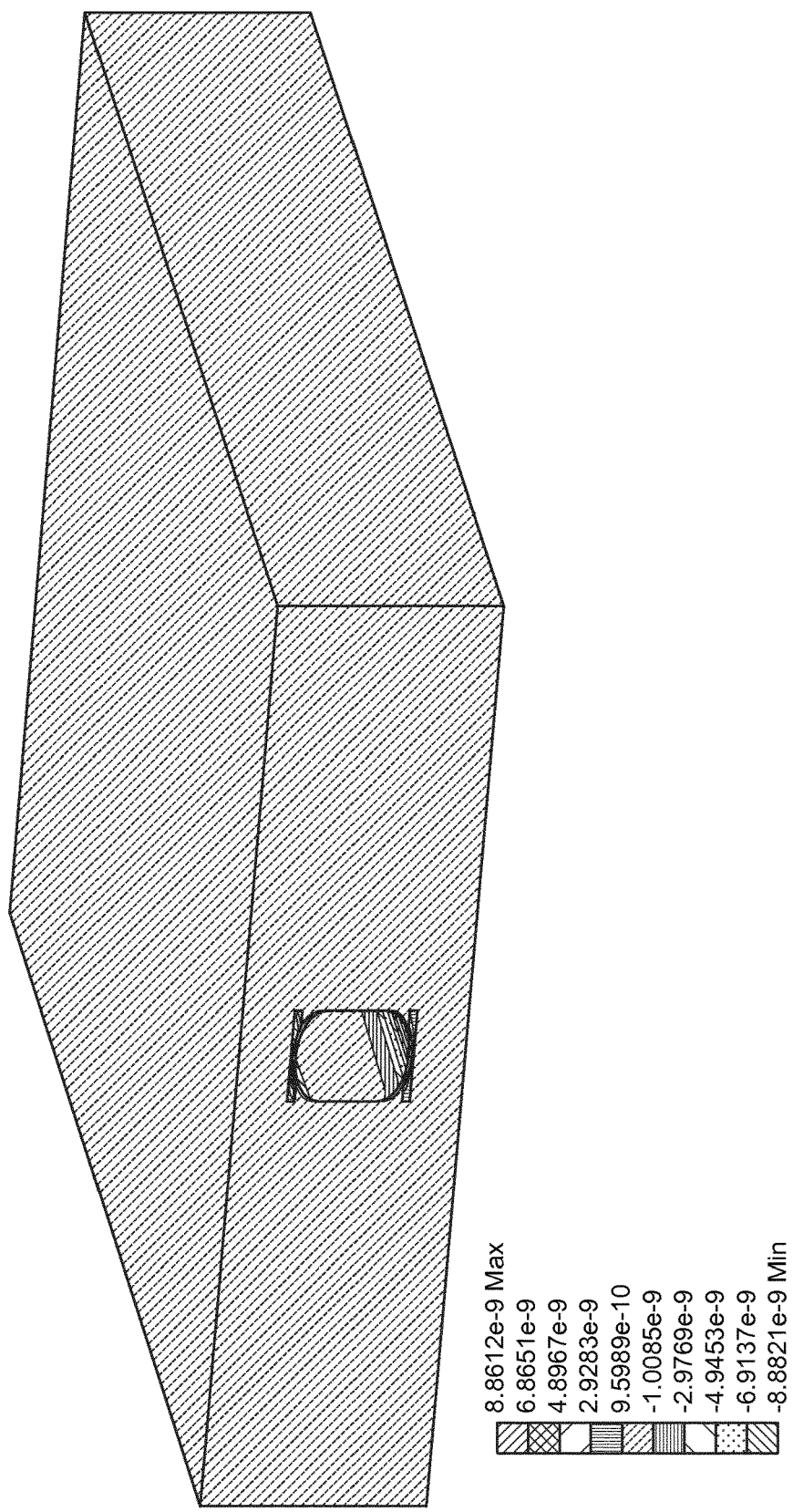
Figure 15:
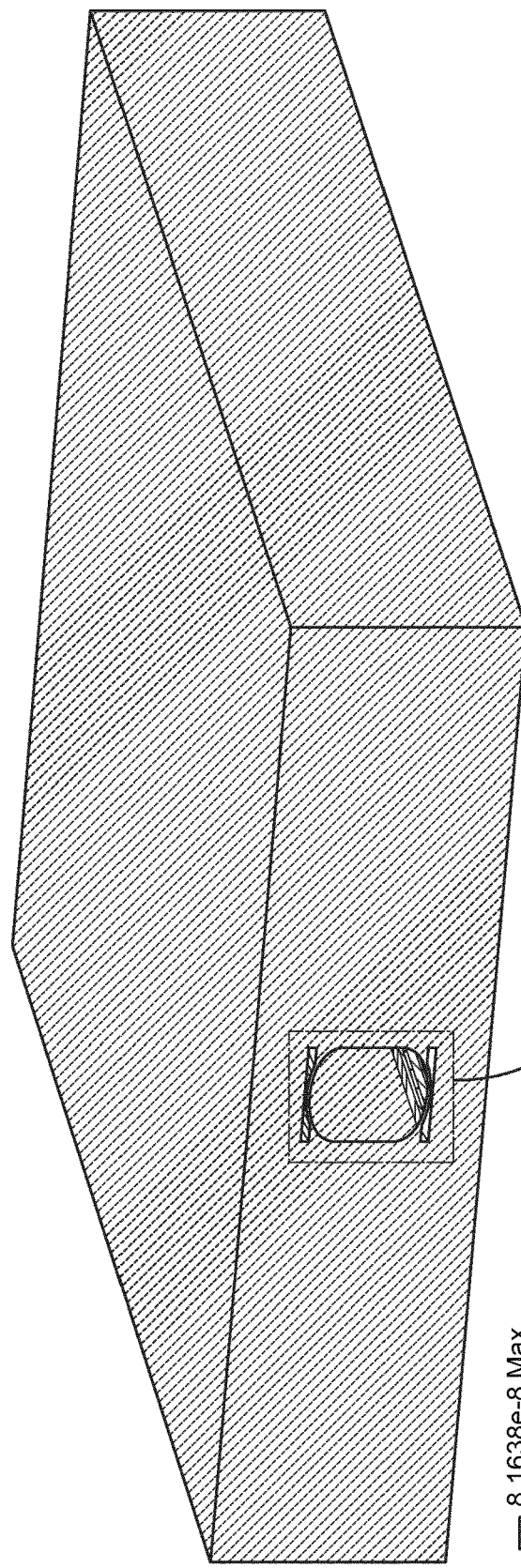
Figure 16:
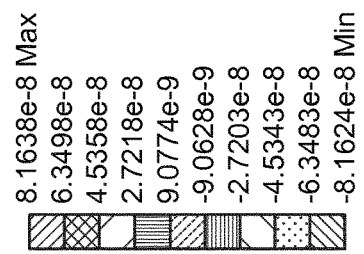
Figure 17:
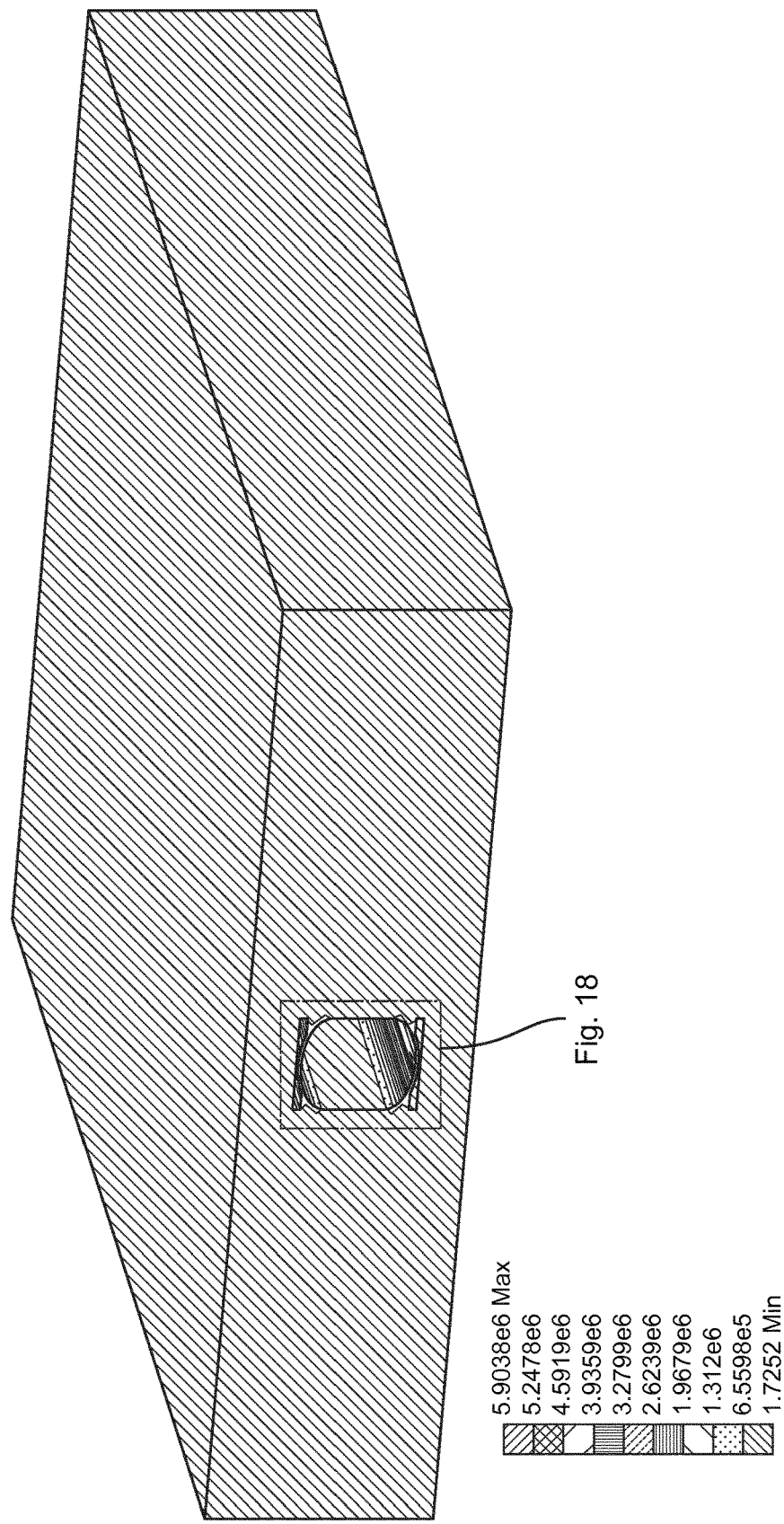
Figure 18:
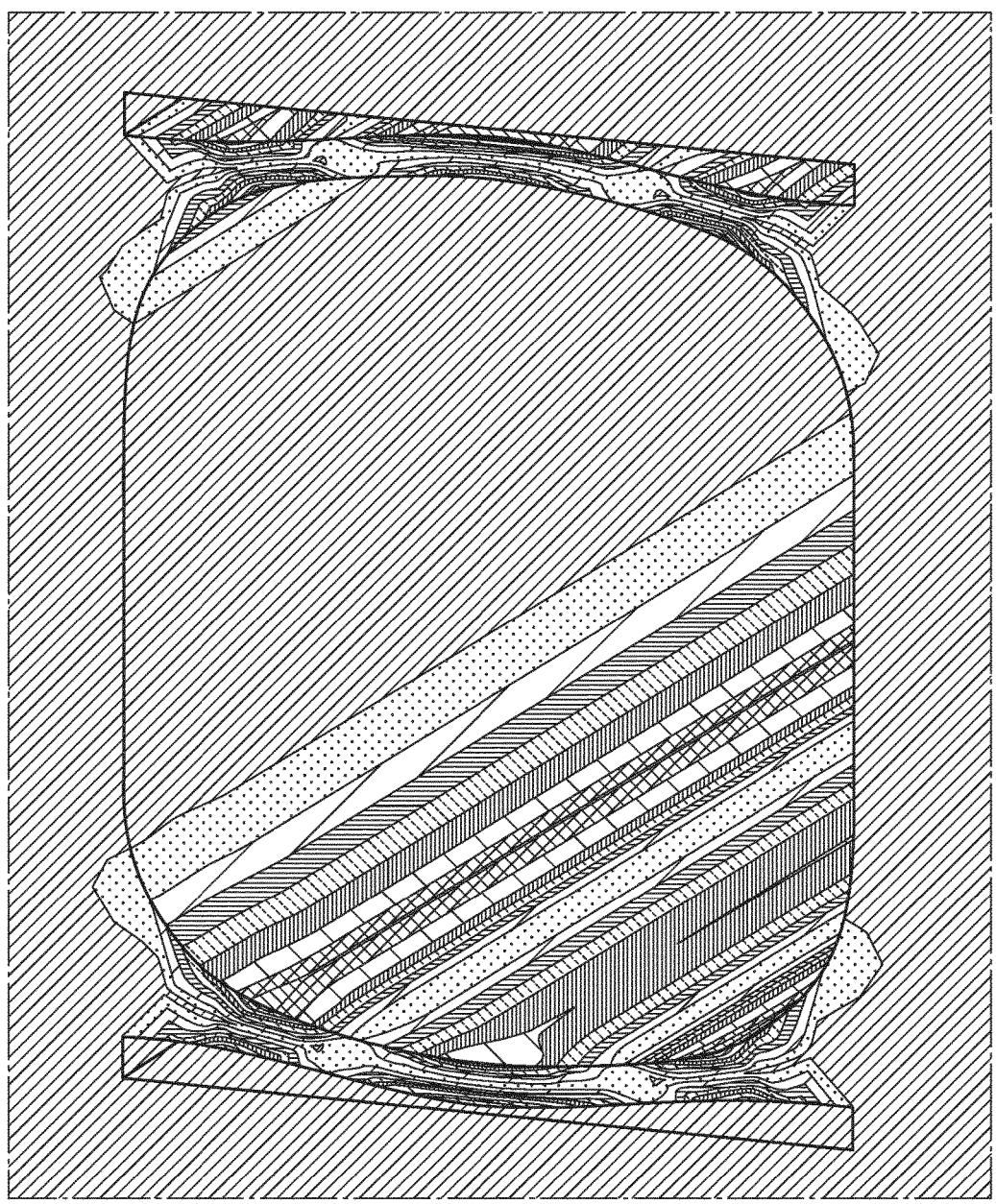

FIG. 13 depicts an example to which the present teachings are applied; a compressible regions 52 in the form of slits are provided in the solid body of SiSiC between the conduit 51 and the upper and lower surfaces. The slits define a deformable region 55 having a thickness at the center of 0.2 mm. Otherwise the model is identical to the example of FIG. 9. FIG. 14 corresponds to FIG. 10 and depicts the horizontal deformation caused by a simulated 1 bar pressure in the conduit 51, i.e. the same as in the reference example. Horizontal deformations are substantially reduced at the surface of the body, indeed a deformation of about 0.01 nm is predicted, a factor of 100 reduction compared to the reference example (see FIG. 10). FIG. 15 corresponds to FIG. 11 and depicts vertical deformation, with the region surrounding the conduit 51 enlarged in FIG. 16. Vertical deformation at the surface is predicted to be about 0.4 nm, a 60% reduction compared to the reference example (see FIG. 11). It can be seen clearly in FIG. 16 that there is a significant deformation of the deformable region 55 between the conduit 51 and the compressible region 52. The maximum deformation is about 80 nm. FIG. 17 corresponds to FIG. 12 and depicts equivalent (von-Mises) stresses in the example of the invention, with the vicinity of the conduit 51 enlarged in FIG. 18. It will be seen that peak stresses within the deformable region are substantially higher than peak stresses in the reference example (see FIG. 12) but still well within acceptable levels.

In an embodiment, there is provided a component for a lithography tool, the component comprising: a member having a primary surface; a conduit defined within the member and configured to receive a fluid under pressure; a compressible region within the member and located between the conduit and the primary surface; and a deformable region between the compressible region and the conduit, wherein the compressible region and the deformable region are configured to accommodate local deformation of the member resulting from the pressure of the fluid.

In an embodiment, the deformable region has the form of a conduit wall between the conduit and the compressible region, the conduit wall being configured to deflect under the pressure of the fluid. In an embodiment, the conduit wall is configured to exert a force in the member to counteract a force exerted by the pressure of the fluid. In an embodiment, the compressible region and the conduit wall are configured to accommodate deflection of the conduit wall induced by the pressure of the fluid, and/or wherein the compressible region and the deformable region are configured to reduce a change in an external dimension of the component in a direction parallel to the primary surface induced by the pressure of the fluid. In an embodiment, the compressible region and the deformable region are configured to prevent a change in a contour of the primary surface induced by the pressure of the fluid. In an embodiment, the component further comprises a second compressible region, the conduit being between the compressible region and the second compressible region. In an embodiment, the member is made of a first material and the compressible region is made of a second material and the bulk modulus of the second material is less than $\frac{1}{10}$ of the bulk modulus of the first material. In an embodiment, the compressible region is a void. In an embodiment, the void is in fluid communication with an atmosphere external to the component. In an embodiment, the void is evacuated to a pressure less than 10 kPa absolute. In an embodiment, the component further comprises a temperature control system configured to circulate a thermal transfer fluid through the conduit as the fluid. In an embodiment, the component is one of: a substrate table, a reflector, a reference frame, an optical support system, or a reticle support.

In an embodiment, there is provided a lithography apparatus comprising a component as described herein.

In an embodiment, there is provided an inspection tool comprising a component as described herein.

In an embodiment, there is provided a device manufacturing method using a lithography apparatus having a component comprising: a member having a primary surface; a conduit defined within the member and configured to receive a fluid under pressure; a compressible region within the member and located between the conduit and the primary surface; and a deformable region between the compressible region and the conduit, wherein the compressible region and the deformable region are configured to accommodate local deformation of the member resulting from the pressure of the fluid.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A component for a lithography tool, the component comprising:
   a member having a primary surface;
   a conduit defined within the member and configured to receive a fluid under pressure;
   a compressible region within the member and located between the conduit and the primary surface; and
   a deformable region between the compressible region and the conduit,
   wherein the compressible region and the deformable region are configured to accommodate local deformation of the member resulting from the pressure of the fluid and wherein the compressible region partially surrounds the conduit.

2. The component according to claim 1, wherein the deformable region has the form of a conduit wall between the conduit and the compressible region, the conduit wall being configured to deflect under the pressure of the fluid.

3. The component according to claim 2, wherein the conduit wall is configured to exert a force in the member to counteract a force exerted by the pressure of the fluid.

4. The component according to claim 2, wherein the compressible region and the conduit wall are configured to accommodate deflection of the conduit wall induced by the pressure of the fluid, and/or wherein the compressible region and the deformable region are configured to reduce a change in an external dimension of the component in a direction parallel to the primary surface induced by the pressure of the fluid.

5. The component according to claim 4, wherein the compressible region and the deformable region are configured to prevent a change in a contour of the primary surface induced by the pressure of the fluid.

6. The component according to claim 1, further comprising a second compressible region, the conduit being between the compressible region and the second compressible region.

7. The component according to claim 1, wherein the member is made of a first material and the compressible region is made of a second material and the bulk modulus of the second material is less than $1/10$ of the bulk modulus of the first material.

8. The component according to claim 1, wherein the compressible region is a void.

9. The component according to claim 8, wherein the void is in fluid communication with an atmosphere external to the component.

10. The component according to claim 9, wherein the void is evacuated to a pressure less than 10 kPa absolute.

11. The component according to claim 1, further comprising a temperature control system configured to circulate a thermal transfer fluid through the conduit as the fluid.

12. The component according to claim 1, the component being one of: a substrate table, a reflector, a reference frame, an optical support system, or a reticle support.

13. A lithography apparatus comprising a component according to claim 1.

14. An inspection tool comprising a component according to claim 1.

15. A device manufacturing method using a lithography apparatus having a component comprising:
   a member having a primary surface;
   a conduit defined within the member and configured to receive a fluid under pressure;
   a compressible region within the member and located between the conduit and the primary surface; and
   a deformable region between the compressible region and the conduit, the method comprising:
   receiving a fluid under pressure to the conduit; and
   accommodating local deformation of the member by the compressible region and the deformable region, resulting from the pressure of the fluid, wherein the compressible region partially surrounds the conduit.

16. The method according to claim 15, wherein the deformable region has the form of a conduit wall between the conduit and the compressible region, and the conduit wall deflecting under the pressure of the fluid.

17. The method according to claim 16, wherein the conduit wall exerts a force in the member to counteract a force exerted by the pressure of the fluid.

18. The method according to claim 15, wherein the component further comprises a second compressible region, the conduit being between the compressible region and the second compressible region.

19. The method according to claim 15, wherein the member is made of a first material and the compressible region is made of a second material and the bulk modulus of the second material is less than $1/10$ of the bulk modulus of the first material.

20. The method according to claim 15, wherein the compressible region is a void.

21. A component for a lithography tool, the component comprising:
- a member having a primary surface;
- a conduit defined within the member and configured to receive a fluid under pressure;
- a compressible region within the member and located between the conduit and the primary surface; and
- a deformable region between the compressible region and the conduit,
- wherein the compressible region and the deformable region are configured to accommodate local deformation of the member resulting from the pressure of the fluid, and
- wherein the deformable region comprises a material the same as a material between the compressible region and the primary surface or comprises a different material with similar or greater stiffness than the material between the compressible region and the primary surface.

* * * * *